United States Patent [19]
Yang et al.

[11] Patent Number: 5,512,507
[45] Date of Patent: Apr. 30, 1996

[54] PROCESS FOR POST METAL CODING OF A ROM, BY GATE ETCH

[75] Inventors: Ming-Tzung Yang; Gary Hong, both of Hsin-chu, Taiwan

[73] Assignee: United Microelectronics Corporation, Hsinchu, Taiwan

[21] Appl. No.: 305,561

[22] Filed: Sep. 14, 1994

[51] Int. Cl.$^6$ .................................................. H01L 21/265
[52] U.S. Cl. .............................. 437/48; 437/52; 437/50
[58] Field of Search .................................. 437/52, 45, 48, 437/60, 47, 919, 49–50

[56] References Cited

U.S. PATENT DOCUMENTS

| | | | |
|---|---|---|---|
| 4,608,748 | 9/1986 | Noguchi et al. | 29/571 |
| 4,818,716 | 4/1989 | Okuyama et al. | 437/49 |
| 5,081,052 | 1/1992 | Kobayashi et al. | 437/29 |
| 5,318,921 | 6/1994 | Hsue et al. | 437/52 |
| 5,429,974 | 7/1995 | Hsue et al. | 437/45 |

*Primary Examiner*—H. Jey Tsai
*Attorney, Agent, or Firm*—George O. Saile; Stephen B. Ackerman

[57] ABSTRACT

A method, and resultant structure, for manufacturing ROM (Read Only Memory) integrated circuits that may be coded, or programmed, after metallization, is described. A plurality of parallel bit lines is formed in a semiconductor substrate. There is a thin insulating layer over the substrate. A plurality of parallel word lines is formed over the thin insulating layer, arranged orthogonally to the bit lines. Gate electrodes of a single conductive material are in coded regions under the word lines, over the thin insulating layer, and between the bit lines, where a ROM code etch has been performed, such that there is a gap between the single conductive material and the word lines. The ROM code etch is performed by an RCA etch of titanium or titanium nitride previously formed between the single conductive material and the word lines. Gate electrodes of two layers of conductive material are in uncoded regions connected to and under the word lines, over the thin insulating layer, and between the bit lines.

17 Claims, 6 Drawing Sheets

PROCESS FOR POST METAL CODING OF A ROM, BY GATE ETCH

BACKGROUND OF THE INVENTION (1) Field of the Invention

This invention relates to ROM (Read Only Memory) manufacturing techniques, and more particularly to a method and structure of coding a ROM after metallization.

(2) Description of the Related Art

ROM devices are well known and widely used in the computer technology. In general, a ROM device is an array of MOSFETs (Metal Oxide Semiconductor Field Effect Transistor) arranged in columns and rows where selected MOSFETs are rendered permanently conductive, or non-conductive, depending on the type of transistor. The ability to set the conductive state of each MOSFET provides a means for storing binary information. In a ROM device, this information is maintained even when power is removed from the circuit.

Figure 1:
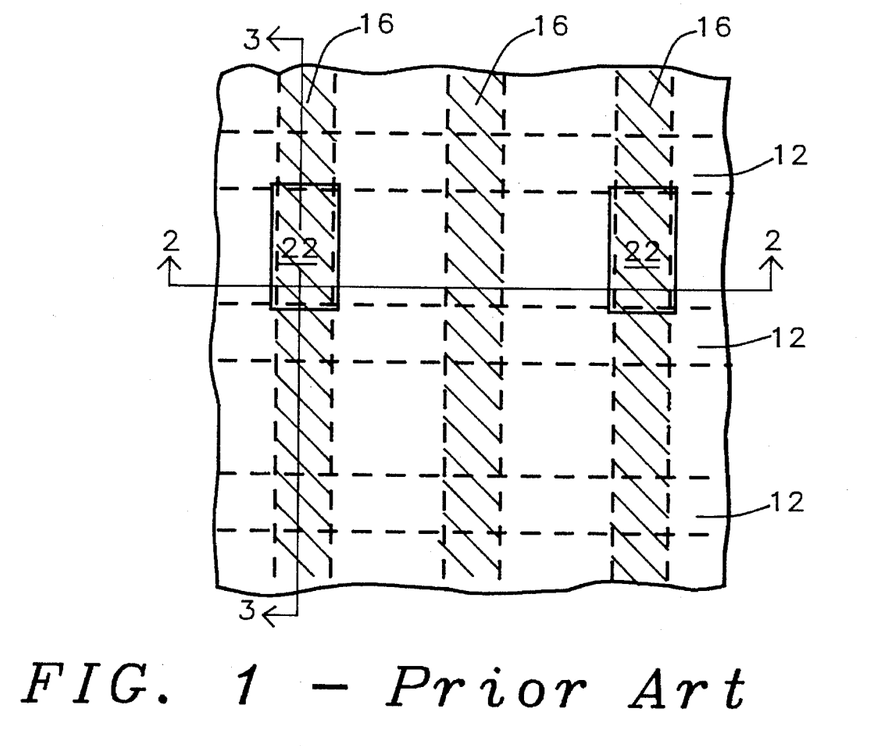
FIGS. 1 through 3 are a top view and two cross-sectional views, respectively, of a typical ROM device structure known in the prior art.
Figure 2:
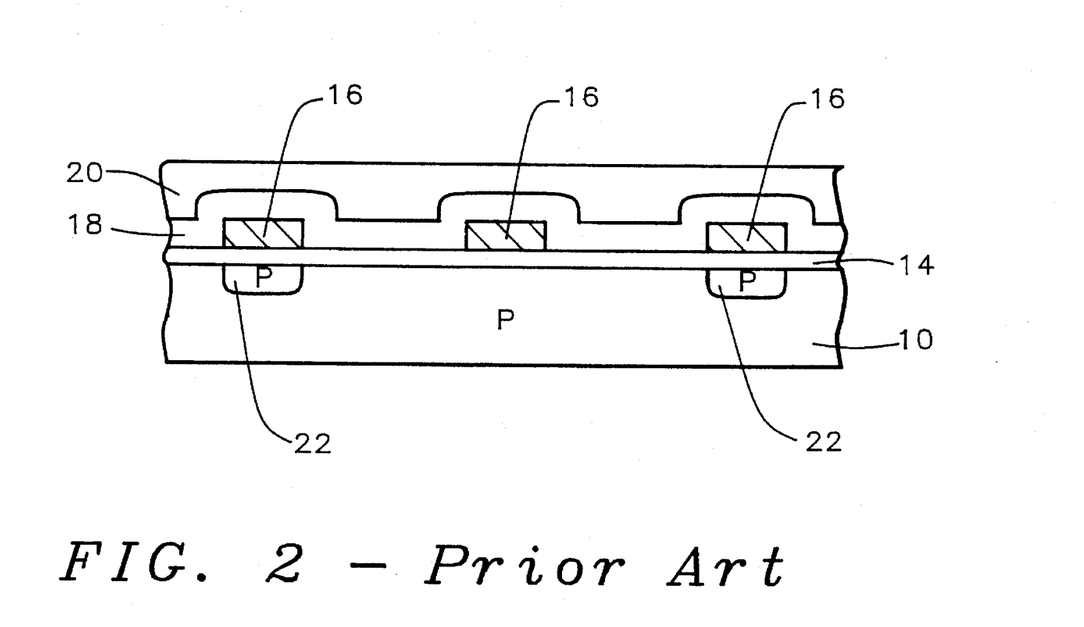
Figure 3:
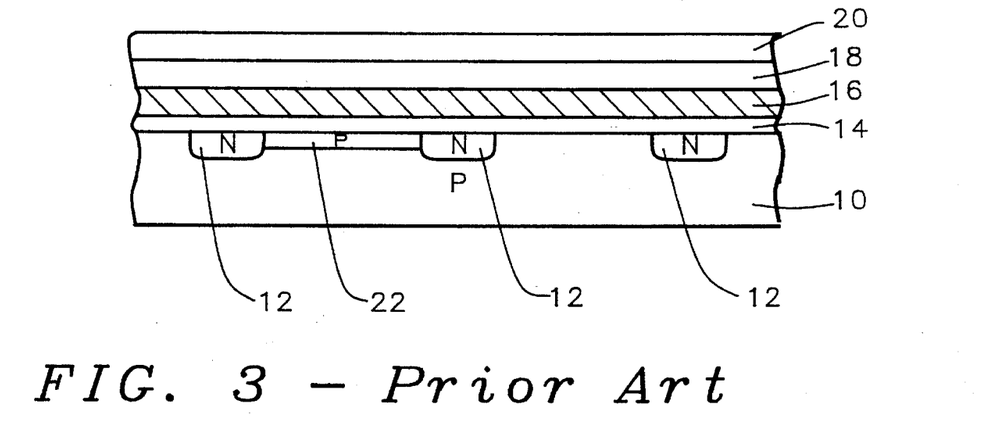

A typical ROM structure is illustrated in FIGS. 1 to 3. A ROM device consists basically of a plurality of parallel, closely spaced, line regions 12, called "bit lines" formed of a heavily doped impurity in a semiconductor substrate 10 having an opposite type background impurity. An insulating layer 14 overlies the substrate 10. A plurality of parallel closely spaced conductive lines 16, called "word lines", arranged orthogonally to the bit line regions 12, are provided on the surface of the substrate 10 on layer 14. Suitable insulating layers 18 and 20 provide insulation for the lines 16. There is also provided a metallization layer (not shown) that operatively connects the line regions 12, and conductive lines 16 to suitable circuitry to address and interrogate the device array.

It can be seen that at the intersection of a word line 16 and a pair of bit lines 12, there is provided an MOSFET. The spaced line regions 12 are the source and drain, the conductive line 16 is the gate electrode, and the layer 14 is the gate insulation layer. Selected MOSFETs can be made permanently conductive by implanting, and activating by an annealing step, a region 22, of an impurity, typically boron, of an opposite type as lines 12, between adjacent lines 12 and beneath the conductive line 16, that is, in the MOSFET channel region. The regions 22 are called code implants and are placed in the substrate to encode specific binary information.

These code implant regions are typically formed very early in the ROM fabrication process, since an anneal step is required to activate the implanted impurity and also recrystallize the implanted area of the substrate. The anneal process involves heating the substrate to a temperature that would cause damage if performed on a completed device, in particular to the metallization and especially if the metallization utilizes aluminum. Aluminum, and aluminum-silicon interfaces, can only tolerate a temperature of 400° to 450° C. Hillock formation and junction spiking can cause device failure if the thermal cycle of the annealing step is performed after the metallization process and exceeds 450° C. for a certain period of time. The melting point of aluminum is 660° C., which creates an absolute upper temperature limit for post-metallization processing.

It is recognized by workers in the art that it is desirable to encode the ROM late in the fabrication process. U.S. Pat. No. 4,608,748 to Noguchi et al, and U.S. Pat. No. 4,818,716 to Okuyama et al involve late ROM programming. However, workers in the art have not thought it possible to program a ROM after metallization for the reasons stated above.

The requirement in the related art that ROM coding be performed early in the ROM fabrication process means that a ROM manufacturer cannot provide a quick turnaround time to a customer supplying the ROM pattern. A programming process that occurred closer to the end of the ROM fabrication would mean a faster turn-around time for ROM customers.

SUMMARY OF THE INVENTION

It is therefore an object of the invention to provide a cost-effective and manufacturable method for producing ROM integrated circuits that may be coded, or programmed, after metallization.

It is a further object of the invention to provide a ROM structure that allows coding after metallization by using an inventive combination of materials for the gate electrode, and an etch to perform the encoding.

These objects are achieved by a method of manufacturing a ROM integrated circuit with post-metallization coding. A first insulating layer is formed over a semiconductor substrate having a first impurity type. A first conductive layer is formed over the insulating layer. A metal layer is formed over the first conductive layer. The metal layer is patterned and the first conductive layer to form a plurality of first parallel conductive lines. A plurality of second parallel conductive lines is formed, in the semiconductor substrate, having a second impurity type opposite to the first impurity type, in the regions between the first parallel conductive lines. The second parallel conductive lines are annealed. A second insulating layer is formed over the first parallel conductive lines and over exposed surfaces of the first insulating layer. The second insulating layer is removed in the region above the metal layer. A second conductive layer is formed over the first parallel conductive lines and the second insulating layer. The second conductive layer and the first parallel conductive lines are patterned, to form third parallel conductive lines that are orthogonal to the second parallel conductive lines, and to form gate electrodes in the regions under the third parallel conductive lines and between the second parallel conductive lines. A thick insulating layer is formed over the third parallel conductive lines and exposed surfaces of the first insulating layer. An interconnecting metallization system is formed over the thick insulating layer to connect the second parallel conductive lines to external circuitry. A thin insulating layer is formed on the metallization system and on the thick insulating layer. A resist layer is deposited on the thick insulating layer. The resist layer is exposed to a desired code pattern designed to tailor the ROM to a particular application, and the resist layer is developed into a mask. Selected gate electrodes are exposed by etching, through openings in the mask, the exposed areas of the thin insulating layer and the thick insulating layer. The resist layer is removed. The metal layer is removed at the selected gate electrodes. A passivation layer is formed on the surface of the device, and final annealing step is performed.

These objects are further achieved by a ROM integrated circuit structure that allows for coding after metallization. A plurality of first, spaced, parallel conductive lines having a first conductivity, is formed in a semiconductor substrate having a second and opposite conductivity. There is a thin insulating layer over the substrate. A plurality of second, spaced, parallel conductive lines is formed over the thin insulating layer, arranged orthogonally to the first, spaced, parallel conductive lines. Gate electrodes of a single conductive material are in coded regions under the second, spaced, parallel conductive lines, over the thin insulating layer, and between the first spaced parallel conductive lines, where a ROM code etch has been performed, such that there is a gap between the single conductive material and the second, spaced, parallel conductive lines. Gate electrodes of two layers of conductive material are in uncoded regions connected to and under the second, spaced, parallel conductive lines, over the thin insulating layer, and between the first spaced parallel conductive lines. A thick insulating layer is formed over the second, spaced, parallel conductive lines and over exposed surfaces of the thin insulating layer. An interconnecting metallization system is over the thick insulating layer, to connect the first, spaced, parallel conductive lines to external circuitry. A passivation layer is formed over the thick insulating layer and over the interconnecting metallization system.

DESCRIPTION OF THE PREFERRED EMBODIMENTS

Figure 4:
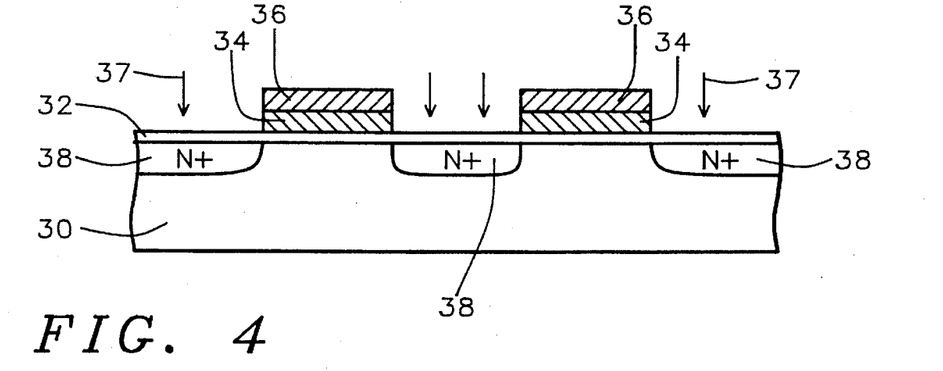
FIGS. 4 and 5 are cross-sectional views of the initial processing steps for the invention for forming a ROM integrated circuit which allows for post-metallization coding.

Referring now to the drawings, more particularly to FIGS. 4 through 9, there is illustrated a method and resulting structure for the novel process for producing ROM devices. Referring now more particularly to FIG. 4, there is illustrated a partially completed ROM structure in which there is a monocrystalline silicon semiconductor substrate 30, which has been doped to a concentration of between about 5 E 14 and 5 E 17 atoms/cm$^3$. The insulating layer 32 is formed on top of the silicon substrate 30, and is typically silicon dioxide (SiO$_2$) formed by thermal oxidation of the substrate, formed by heating to a temperature of between about 700° and 1100° C. for between about 5 and 120 minutes, to form a layer with a thickness of between about 50 and 500 Angstroms. This layer may also be formed by low pressure chemical vapor deposition (LPCVD) or plasma enhanced chemical vapor deposition (PECVD). A polysilicon layer 34 is now formed on oxide layer 32 by LPCVD to a thickness of between about 300 and 5000 Angstroms. The polysilicon layer 34 is doped with phosphorus oxychloride (POCl$_3$) at between about 800° and 950° C. Alternatively, the polysilicon layer can be doped in situ, i.e., during its deposition, or by ion implantation.

In a key step of the invention, a metal layer 36 is formed over the polysilicon layer. This metal layer is formed preferably of titanium nitride, or may also be titanium, to a thickness of between about 100 and 3000 Angstroms, by sputtering at a temperature of between about 0° and 500° C. and a pressure of less than about 1 E −5 torr. Or it could be deposited by CVD at a pressure of between about 1 and 760 torr.

The polysilicon and metal layers are then patterned by conventional lithography and etching to form parallel conductive lines, as shown in the cross-sectional view of FIG. 4, and are patterned so that the lines will act as a mask for the formation of bit lines 38. The bit lines are formed by an ion implant 37 of an N-dopant such as arsenic (As) at a concentration of between about 1 E 14 and 1 E 16 atoms/cm.$^2$. Annealing is then performed to drive in the dopant, by heating the substrate to a temperature of between about 600° and 1000° C. for between about 5 and 60 minutes. The oxide 32 thickens during this anneal in the region above the N+ bit line 38.

Silicon dioxide (SiO$_2$) is deposited by CVD on top of metal line 36 and then etched back to expose the surface of line 36 and form sidewall spacers 40 on the sides of lines 34 and 36. A dry etch is used, such as reactive ion etching (RIE) with CHF$_3$ (trifluoromethane)+O$_2$/H$_2$ (oxygen/hydrogen), or CF$_4$ (carbon tetrafluoride)+O$_2$/H$_2$.

Figure 5:
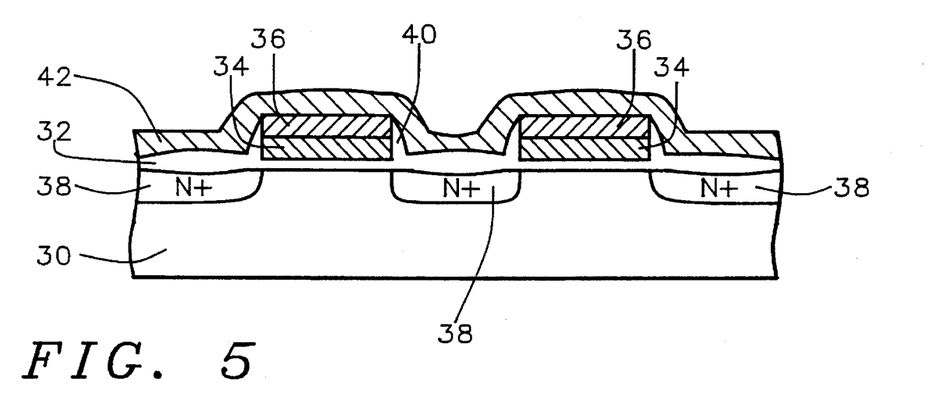

Referring to FIG. 5, a second polysilicon deposition is performed by LPCVD, to deposit layer 42 having a thickness of between about 300 and 5000 Angstroms. Doping is by diffusion with phosphorus oxychloride (POCl$_3$) at between about 800° and 950° C. Alternatively, the polysilicon layer can be doped in situ, or ion implanted. The polysilicon is then patterned by conventional lithography and etching to form parallel conductive lines, which operate as word lines 43 for the ROM. Etching is accomplished by a plasma etch using Cl$_2$ (chlorine), or HBr (hydrogen bromide), or a Hbr/Cl$_2$/HBr multi-step etch to remove the poly 42, TiN 36 and poly 34 in those areas not defined by word lines, so that these two layers remain in the ROM memory cell gate regions.

Figure 6:
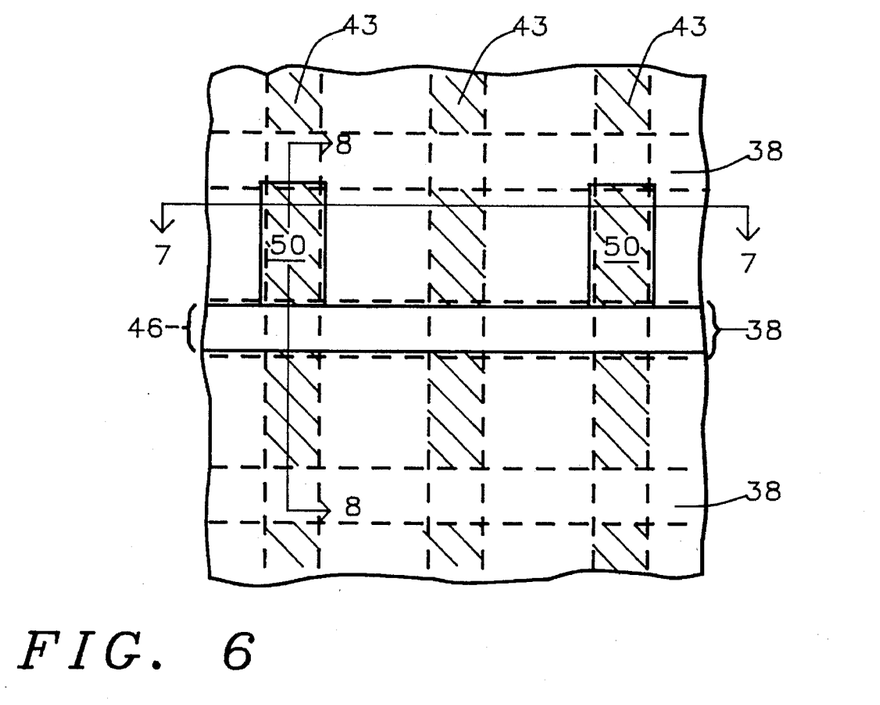
FIG. 6 is a top view of the ROM integrated circuit of the invention after metallization and during ROM coding.
Figure 7:
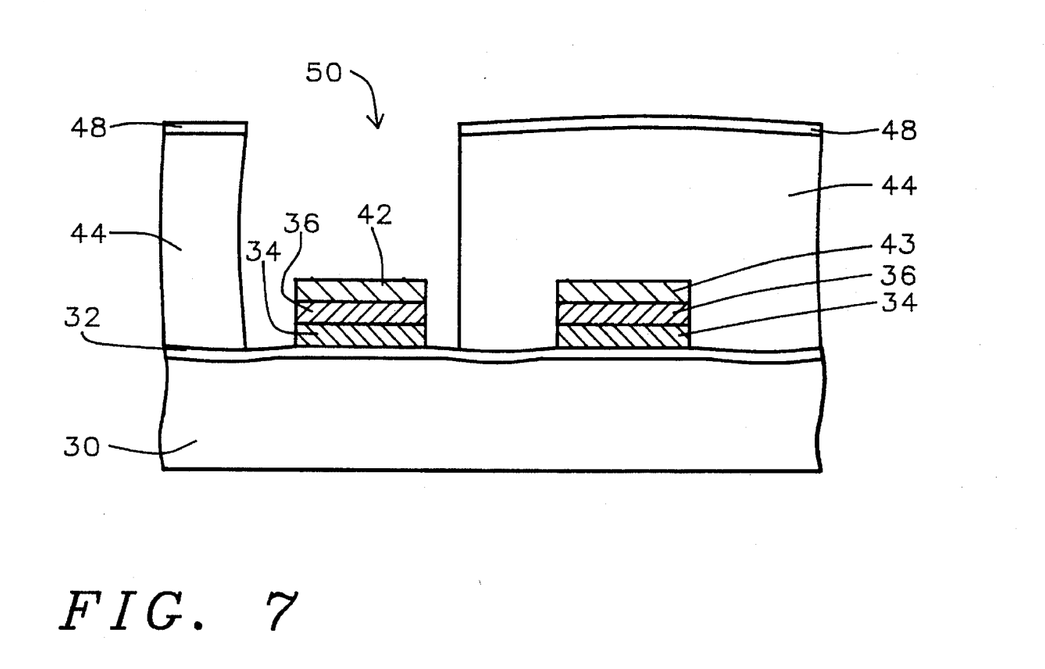
FIG. 7 is a cross-sectional view of FIG. 6 along line 7—7, before coding.
Figure 8:
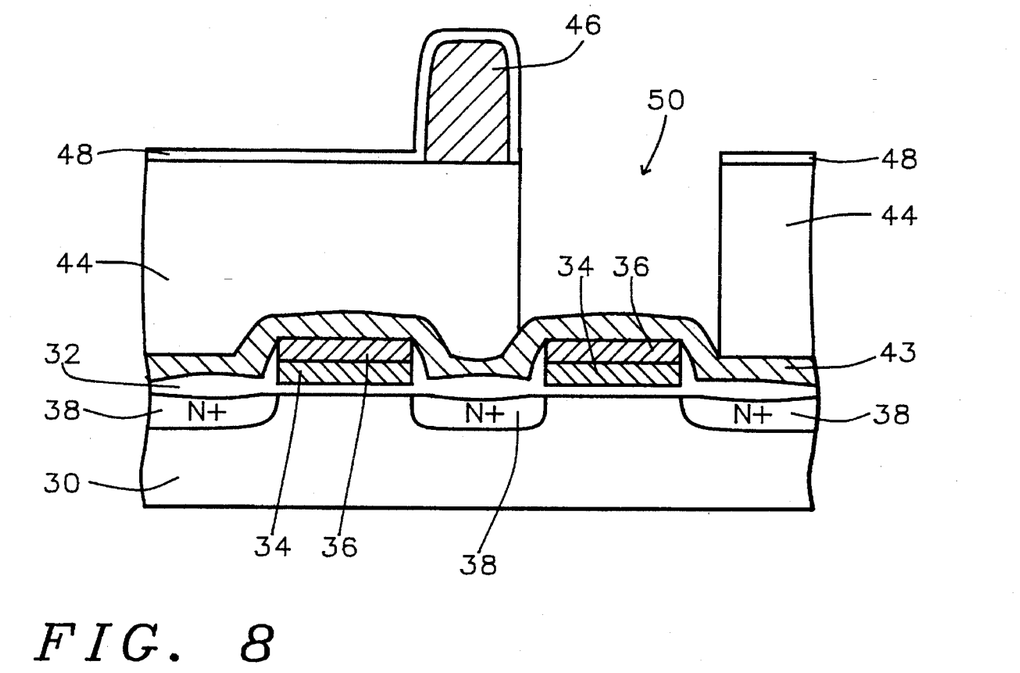
FIG. 8 is a cross-sectional view of FIG. 6 along line 8—8, before coding.
Figure 9:
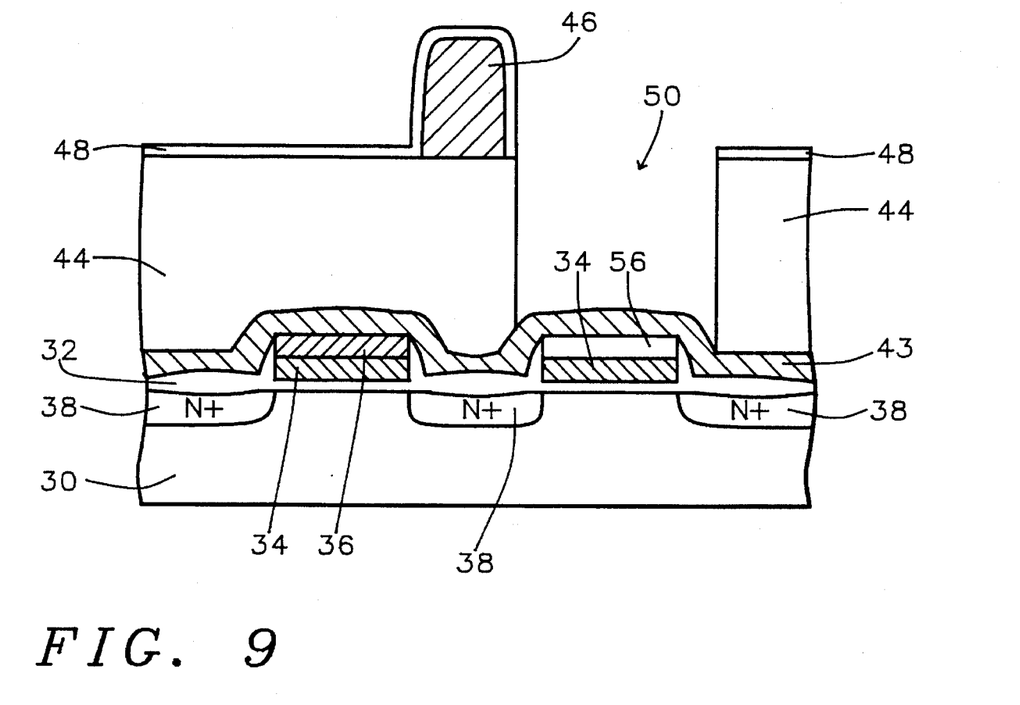
FIG. 9 is a cross-sectional view of FIG. 6 along line 8—8, after the critical ROM code etching step of the invention.

With reference to FIGS. 6 through 9, deposition of a thick insulator, metallization, and the key ROM programming steps will be described. A thick insulating layer 44 is formed of BPSG (borophosphosilicate glass) or PSIG (phosphosilicate glass) over the entire structure, to a thickness of between about 1500 and 10,000 Angstroms. A metallization system is then fabricated on layer 44 which connects the bit lines to external circuitry, after contact etching through layer 44. The metallization system is typically formed of aluminum, and is deposited by sputtering to a thickness of between about 3000 and 12,000 Angstroms. A metal line 46 is shown in FIGS. 8 and 9, and is laid out in order not to block out the gate electrode areas where openings 50 are formed for the ROM coding.

After metallization, a thin layer 48 of SiO$_2$ of between about 100 and 1000 Angstroms is formed over the metal lines and BPSG, by CVD (APCVD (atmospheric pressure chemical vapor deposition) or PECVD).

The critical coding method of the invention is now performed. A resist layer (not shown) is deposited, exposed to define the coding pattern, and developed to form a ROM code mask. The thin oxide 48 and BPSG 44 are now etched by an oxide dry etcher using CHF$_3$+O$_2$/H$_2$, or CF$_4$+O$_2$/H$_2$ in those regions where it is desired to make the memory cell non-conductive, such as openings 50 in the FIG. 6 top view. Also shown in FIG. 6 are bit lines 38 and word lines 42, and metallization interconnect line 46. Gate electrode locations, where polysilicon 34 and metal 36 remain under the word lines 43, are indicated by cross-hatching in FIG. 6. FIG. 7 is a cross-sectional view along line 7—7 of FIG. 6, showing opening 50 to expose the gate electrode and, in particular, metal 36. FIG. 8 is a cross-sectional view along line 8—8 of FIG. 6.

The key step of the ROM code etch is now performed through openings 50, to make permanently nonconductive the memory cells at those locations. An RCA etch is performed, using $NH_4OH$ (ammonium hydroxide)$+H_2O_2$ (hydrogen peroxide) at room temperature, for between about 3 and 30 minutes, using a ratio of $NH_4OH:H_2O_2:DI$ water of 1:1:10, or alternately, 0.5:1:10, which is by volume. This etch completely removes metal 36 since $NH_4OH+H_2O_2$ etches Ti or TiN but does not etch polysilicon or $SiO_2$. This forms an electrical disconnect, as shown in FIG. 9, between first polysilicon 34 and second polysilicon word line 42.

Subsequently, during operation a voltage on the word line will not turn-on the MOS transistor at any location where the disconnect has been fabricated. The thickness of the gap 56 that is formed is determined by the deposition thickness of layer 36, and is between about 100 and 3000 Angstroms. Since the etch does not require high-temperature processing, no damage is done to the metallization system already formed on the device. In a conventional ROM, on the other hand, the ROM code implant causes implant damage and thus a high temperature anneal is required.

At those locations where metal 34 is not etched, a MOS transistor exists. A code implant is not needed since the substrate doping for the ROM of the invention is the same as a standard MOS, i.e., between about 5 E 14 and 5 E 17 atoms/cm$^3$, rather than the usual ROM doping of between about 1 E 19 and 2 E 19 atoms/cm$^3$.

Following the completion of the ROM programming, a passivation layer (not shown) is deposited over thin oxide 48 and in code openings 50, to a thickness of between about 5000 and 15,000 Angstroms. This layer is formed of $SiO_2$, $Si_3N_4$ (silicon nitride), $SiO_xN_y$ (silicon oxynitride) or $SiO_2/Si_3N_4$, and is deposited by CVD.

Figure 10:
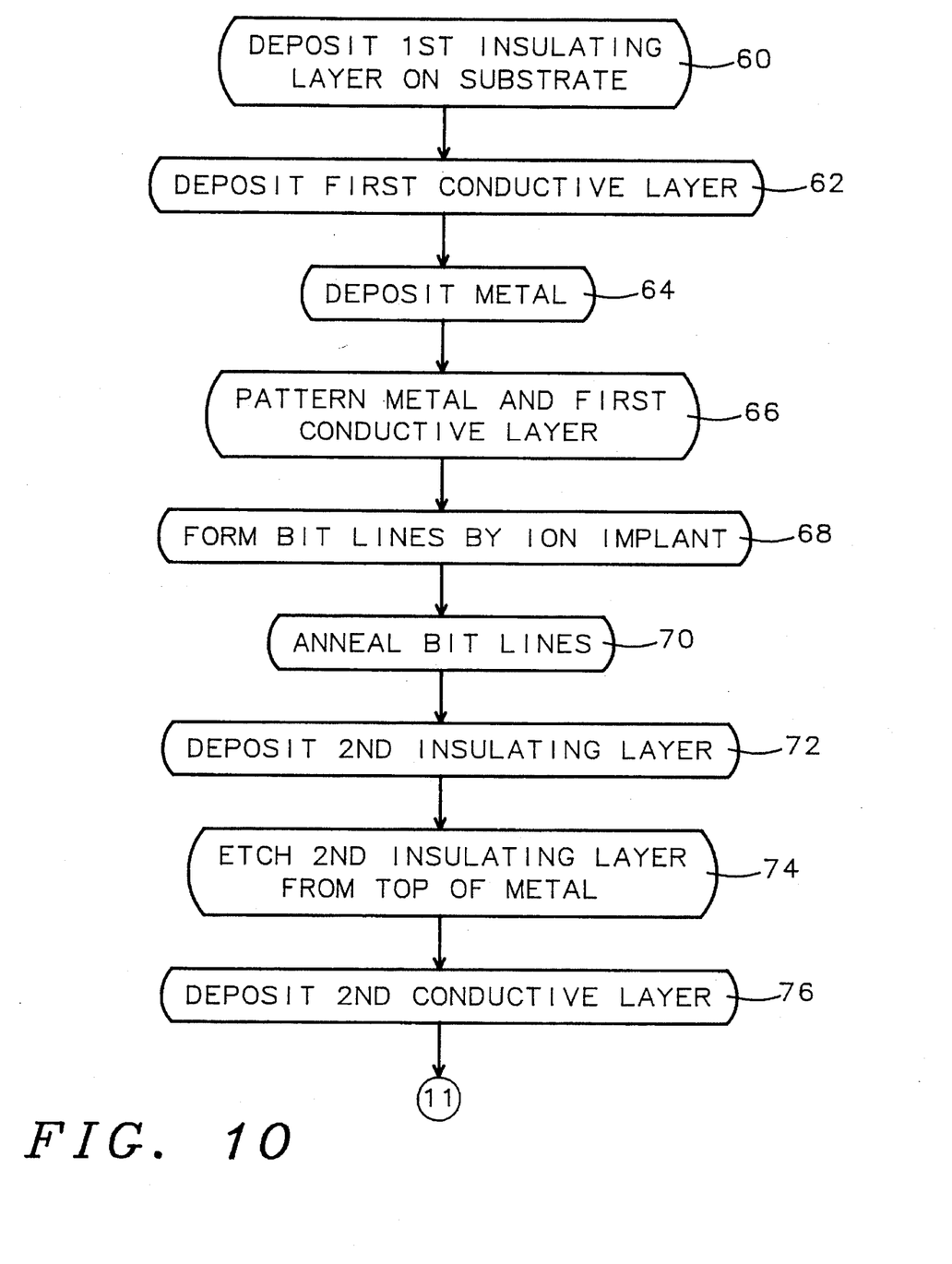
FIGS. 10 and 11 are process flow charts in accordance with this invention.
Figure 11:
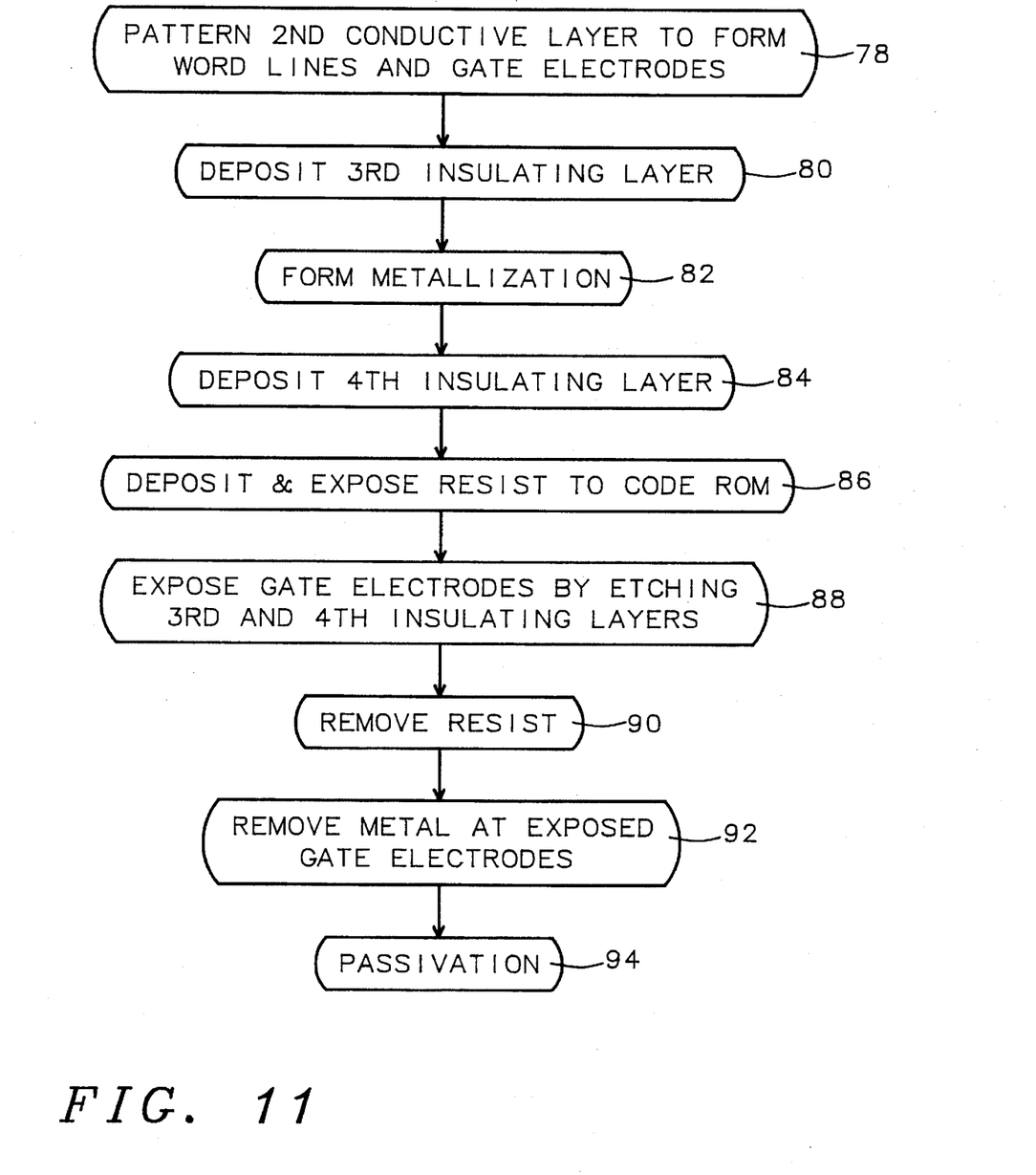

The method of the invention can be more clearly understood by reference to the process flowcharts of FIGS. 10 and 11. Referring now to FIG. 10, in flowchart step 60 a first insulating layer, typically $SiO_2$, is formed on a semiconductor substrate having a first conductivity type. In step 62, a first conductive layer, of doped polysilicon, is formed over the first insulating layer. In an important step of the invention, shown as step 64, a metal layer of titanium nitride or titanium is deposited over the poly layer. In step 66, the metal layer and doped polysilicon layer are patterned to form first parallel conductive lines. These lines are used in step 68 as a mask for the formation of bit lines for the ROM. The bit lines are formed in the substrate by ion implanting with a second conductivity type ion, opposite to the substrate conductivity type. The bit lines are annealed in step 70.

A second insulating layer, for example of $SiO_2$ is then conformally deposited in step 72. This insulating layer is dry etched in Step 74 to expose the top of the metal lines and to form sidewalls on the sides of the first parallel conductive lines. In step 76, a second conductive layer, of doped polysilicon, is deposited conformally over the structure.

Another important step of the invention is shown as step 78 in FIG. 11. The second conductive layer and the first parallel conductive lines are patterned. This patterning is performed to form word lines for the ROM which run orthogonally to the bit lines. It also is used to form gate electrodes, formed of the metal layer and first polysilicon, under portions of the word line that lie between the bit lines.

In step 80, a third insulating layer, of BPSG or PSIG, is formed over the word lines and exposed areas of the bit lines. In step 82, an interconnecting metallization system is formed by depositing and patterning aluminum. In step 84, a fourth insulating layer, of $SiO_2$, is formed over the BPSG/PSG and over the metallization system. In step 86, photoresist is deposited, exposed and developed to form a ROM code mask. Gate electrodes under the mask openings are exposed, in step 88, by etching the third and fourth insulating layers. The resist is removed in step 90.

In the final important step of the invention, in step 92, the metal in the regions at the exposed gate electrodes is removed, by an RCA etch, thereby electrically disconnecting the overlying word lines from the underlying gate electrode. Finally, a passivation layer is formed over the structure, in step 94.

By performing the ROM coding very near the end of the fabrication process, a very rapid turn-around time can be achieved. This reduces the cost of the ROM device, since it reduces labor cost, equipment expense and increases the response time to customer requirements. Furthermore, nearly completed, but uncoded, ROM devices can be stockpiled until an order is received and specifically programmed devices can be quickly produced by performing the few process steps remaining.

While the invention has been particularly shown and described with reference to the preferred embodiments thereof, it will be understood by those skilled in the art that various changes in form and details may be made without departing from the spirit and scope of the invention.

What is claimed is:

1. A method of manufacturing a ROM integrated circuit with post-metallization coding, comprising the steps of:

forming a first insulating layer over a semiconductor substrate having a first conductivity type;

forming a first conductive layer over said first insulating layer;

forming a metal layer over said first conductive layer;

patterning said metal layer and said first conductive layer to form a plurality of first parallel conductive lines;

forming a plurality of bit lines, in said semiconductor substrate, having a second conductivity type opposite to said first conductivity type, in regions between said first parallel conductive lines;

annealing said bit lines;

forming a second insulating layer over said first parallel conductive lines and over said bit lines;

removing said second insulating layer in a region above said first parallel conductive lines to form sidewall spacers;

forming a second conductive layer over and contacting said first parallel conductive lines and over said sidewall spacers;

patterning said second conductive layer and said first parallel conductive lines, to form a plurality of second parallel conductive lines that are orthogonal to said bit lines, and to form gate electrodes in regions under said second parallel conductive lines and between said bit lines and exposing a portion of said first insulating layer;

forming a third insulating layer over said second parallel conductive lines and said exposed surfaces of said first insulating layer;

forming an interconnecting metallization system over said third insulating layer to connect said bit lines to an external circuitry;

forming a fourth insulating layer on said metallization system and on said third insulating layer;

depositing a resist layer on said fourth insulating layer;

exposing said resist layer to a code pattern, and developing said resist layer into a mask;

exposing gate electrodes by etching, through openings in said mask, said fourth insulating layer and said third insulating layer;

removing said resist layer;

removing said metal layer at said gate electrodes; and depositing a passivation layer over said integrated circuit.

2. The method of claim 1 wherein said metal layer is formed of titanium nitride.

3. The method of claim 2 wherein said removing said metal layer is by etching with a solution of ammonium hydroxide and hydrogen peroxide.

4. The method of claim 1 wherein said metal layer is formed of titanium.

5. The method of claim 1 wherein said first conductive layer is formed of doped polycrystalline silicon.

6. The method of claim 1 wherein said patterning said second conductive layer and said first parallel conductive lines is accomplished by etching with chlorine.

7. The method of claim 1 wherein said exposing gate electrodes is accomplished by etching with trifluoromethane and oxygen/hydrogen.

8. The method of claim 1 wherein said first conductive layer is formed to a thickness of between about 300 and 5000 Angstroms.

9. The method of claim 1 wherein said second conductive layer is formed to a thickness of between about 300 and 5000 Angstroms.

10. The method of claim 1 wherein said metal layer is formed to a thickness of between about 100 and 3000 Angstroms.

11. The method of claim 1 wherein said first conductivity type has a concentration in said semiconductor substrate of between about 5 E 14 and 5 E 17 atoms/cm$^3$.

12. A method of encoding a ROM integrated circuit after metallization, comprising the steps of:

forming a first insulating layer over a semiconductor substrate having a first conductivity type:

forming a first conductive layer over said first insulating layer;

forming a metal layer over said first conductive layer;

patterning said metal layer and said first conductive layer to form a plurality of first parallel conductive lines;

forming a plurality of bit lines, in said semiconductor substrate, having a second conductivity type opposite to said first conductivity type, in regions between said first parallel conductive lines;

annealing said bit lines;

forming a second insulating layer over said first parallel conductive lines and said bit lines;

removing said second insulating layer in a region above and adjacent to said metal layer to form sidewall spacers;

forming a second conductive layer over and contacting said first parallel conductive lines and over said sidewall spacers;

patterning said second conductive layer and said first parallel conductive lines, to form a plurality of second parallel conductive lines that are orthogonal to said bit lines, and to form gate electrodes in regions under said second parallel conductive lines and between said bit lines;

forming a third insulating layer over said second parallel conductive lines and said first insulating layer;

forming an interconnecting metallization system over said third insulating layer to connect said second parallel conductive lines to an external circuitry;

forming a fourth insulating layer on said metallization system and on said third insulating layer;

depositing a resist layer on said fourth insulating layer;

exposing said resist layer to a code pattern, and developing said resist layer into a mask;

exposing gate electrodes by etching, through openings in said mask, said fourth insulating layer and said third insulating layer;

removing said resist layer;

encoding said ROM integrated circuit by removing said metal layer at said gate electrodes; and depositing a passivation layer over said integrated circuit.

13. The method of claim 12 wherein said metal layer is formed of titanium nitride.

14. The method of claim 13 wherein said encoding said ROM integrated circuit is accomplished by etching said metal layer with a solution of ammonium hydroxide and hydrogen peroxide.

15. The method of claim 12 wherein said metal layer is formed of titanium.

16. The method of claim 12 wherein said metal layer is formed to a thickness of between about 100 and 3000 Angstroms.

17. The method of claim 12 wherein said first conductivity type has a concentration in said semiconductor substrate of between about 5 E 14 and 5 E 17 atoms/cm$^3$.

* * * * *